US009835913B2

(12) United States Patent
Pellerite et al.

(10) Patent No.: US 9,835,913 B2
(45) Date of Patent: Dec. 5, 2017

(54) TRANSPARENT ELECTRODE FOR ELECTRONIC DISPLAYS

(75) Inventors: Mark J. Pellerite, Woodbury, MN (US); Marc D. Radcliffe, Newport, MN (US); John P. Baetzold, North St. Paul, MN (US); Marie A. Boulos, West St. Paul, MN (US); Michael L. Steiner, New Richmond, WI (US); John J. Stradinger, Roseville, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 627 days.

(21) Appl. No.: 13/983,593

(22) PCT Filed: Apr. 3, 2012

(86) PCT No.: PCT/US2012/031960
§ 371 (c)(1),
(2), (4) Date: Aug. 5, 2013

(87) PCT Pub. No.: WO2012/145157
PCT Pub. Date: Oct. 26, 2012

(65) Prior Publication Data
US 2014/0085573 A1    Mar. 27, 2014

Related U.S. Application Data (60) Provisional application No. 61/475,860, filed on Apr. 15, 2011.

(51) Int. Cl.
*G02F 1/1333* (2006.01)
*G02F 1/1343* (2006.01)
(Continued)

(52) U.S. Cl.
CPC .......... *G02F 1/13439* (2013.01); *B82Y 10/00* (2013.01); *G02F 1/133345* (2013.01);
(Continued)

(58) Field of Classification Search
CPC ........... G02F 1/133345; G02F 1/13439; G02F 1/133528
See application file for complete search history.

(56) References Cited

U.S. PATENT DOCUMENTS 5,585,035 A    12/1996   Nerad
5,641,426 A    6/1997   Nerad
(Continued)

FOREIGN PATENT DOCUMENTS

WO    WO 93-14436    7/1993
WO    WO 2007-034994    3/2007
(Continued)

OTHER PUBLICATIONS

NanoMarkets, "The Future of ITO: Transparent Conductor and ITO Replacement Markets," Feb. 2008, pp. 1-5.
(Continued)

*Primary Examiner* — Phu Vu
(74) *Attorney, Agent, or Firm* — Carolyn A. Fischer (57) ABSTRACT

A transparent electrode is described and includes metallic nanowires and a polymeric overcoat layer for protecting the nanowires from corrosion and abrasion. The polymeric overcoat layer includes nanoparticles selected from the group consisting of antimony tin oxide, zinc oxide and indium tin oxide, and has a sheet resistance of greater than about 107 ohm/sq. The transparent electrode can be used in electronic displays such as polymer-dispersed liquid crystal, liquid crystal, electrophoretic, electrochromic, thermochromic, electroluminescent and plasma displays.

17 Claims, 2 Drawing Sheets

(51) Int. Cl.
*B82Y 10/00* (2011.01)
*H05B 33/28* (2006.01)

(52) U.S. Cl.
CPC ....... *G02F 1/133365* (2013.01); *H05B 33/28* (2013.01); *G02F 2202/36* (2013.01); *H01L 2924/0002* (2013.01)

(56) References Cited

U.S. PATENT DOCUMENTS

| | | | |
|---|---|---|---|
| 5,867,238 | A | 2/1999 | Miller |
| 6,785,036 | B1 | 8/2004 | Berneth |
| 7,507,449 | B2 | 3/2009 | Chari |
| 8,138,568 | B2 | 3/2012 | Yoon |
| 8,618,531 | B2 | 12/2013 | Alden |
| 2002/0145579 | A1 | 10/2002 | Yamakita |
| 2004/0195967 | A1 | 10/2004 | Padiyath |
| 2007/0102682 | A1 | 5/2007 | Kodas |
| 2008/0138610 | A1* | 6/2008 | Neuhauser ................ C08J 7/06 428/334 |
| 2008/0143906 | A1* | 6/2008 | Allemand .............. B82Y 10/00 349/43 |
| 2008/0259262 | A1 | 10/2008 | Jones |
| 2009/0174925 | A1 | 7/2009 | Weber |
| 2009/0218310 | A1 | 9/2009 | Zu |
| 2010/0073936 | A1 | 3/2010 | Padiyath |
| 2010/0101839 | A1 | 4/2010 | Saran |
| 2010/0272933 | A1 | 10/2010 | McCormick |
| 2011/0017963 | A1* | 1/2011 | Wu ........................ B82Y 30/00 252/587 |
| 2011/0272176 | A1 | 11/2011 | Goto |
| 2014/0338735 | A1 | 11/2014 | Allemand |

FOREIGN PATENT DOCUMENTS

| | | |
|---|---|---|
| WO | WO 2008-046058 | 4/2008 |
| WO | WO 2009-079249 | 6/2009 |
| WO | WO 2009-108306 | 9/2009 |
| WO | WO 2010-082429 | 7/2010 |
| WO | WO 2010-129604 | 11/2010 |

OTHER PUBLICATIONS

Collings, "Liquid Crystalline Materials", Kirk-Othmer Encyclopedia of Chemical Technology, $5^{th}$ Ed.., vol. 15, pp. 81-120, (2005).

De, "Silver Nanowire Networks as Flexible, Transparent, Conducting Films: Extremely High DC to Optical Conductively Ratios", American Chemical Society Nano, 2009, vol. 3, No. 7, pp. 1767-1774.

Hayes, "Video-Speed Electronic Paper Based on Electrowetting", Nature, Sep. 2003, vol. 425, pp. 383-385.

Heikenfeld, "Electrofluidic displays using Young-Laplace Transposition of Brilliant Pigment Dispersions", Nature Photonics, Apr. 26, 2009, vol. 3, pp. 292-296.

Herz, "Electrophoretic Display Technology: The beginnings, the improvements, and a future in flexible electronics", May 19, 2006, Materials Science and Engineering, Cornell University, Ithaca, NY (MSE 542) pp. 1-15.

Weast, Handbook of Chemistry and Physics, $50^{th}$ Ed., pp. F-140-141 (1970).

International Search Report for PCT International Application No. PCT/US2012/031960, dated Jul. 18, 2012, 5 pages.

* cited by examiner

TRANSPARENT ELECTRODE FOR ELECTRONIC DISPLAYS

CROSS REFERENCE TO RELATED APPLICATION

This application claims the benefit of U.S. Provisional Patent Application No. 61/475,860, filed Apr. 15, 2011, the disclosure of which is incorporated by reference herein in its entirety.

FIELD OF INVENTION

This disclosure relates to electronic displays such as liquid crystal and electrophoretic displays, and particularly to transparent electrodes for such displays.

BACKGROUND

Electronic displays, also referred to as light modulating devices, comprise an imaging material having optical properties which change in response to an electric field or current and return to an original condition upon reversing or removing the field or current. For example, the optical properties of an imaging material can change such that a display reflects or transmits light in response to the electric field. Imaging materials include liquid crystalline materials such as cholesteric liquid crystals and liquid crystalline droplets dispersed in a polymer matrix. Electronic displays comprising the latter are referred to as polymer dispersed liquid crystal (PDLC) displays. Electrophoretic and electrochromic materials can also be used to make electronic displays.

Electronic displays include a pair of substrates that form a cell, and the imaging material is contained within the cell. At least one of the substrates comprises an optically transparent, thin conductive film referred to as a transparent conductor. Typical transparent conductors include conductive materials deposited as a thin layer on a substrate; exemplary conductive materials include metals, metal oxides, carbon nanotubes and conductive polymers.

Electronic displays such as those described above are used as electronic devices suitable for use in a variety of applications such as such as electronic paper, computer monitors, handheld devices, signage and the like.

SUMMARY

A transparent electrode is disclosed herein. The transparent electrode comprises a transparent substrate bearing a strip, plane or surface that is electrically conductive (sheet resistivity of less than about $10^4$ sq/ohm) and transmits radiation of at least some portion of the electromagnetic spectrum: In particular, the transparent electrode comprises: a transparent substrate, a conductive layer disposed on the transparent substrate and comprising metallic nanowires, a polymeric overcoat layer disposed on the conductive layer and comprising nanoparticles selected from the group consisting of antimony tin oxide, zinc oxide and indium tin oxide, wherein a sheet resistance of the polymeric overcoat layer disposed on the transparent substrate without the conductive layer is greater than about $10^7$ ohm/sq.

The transparent electrode can be used in display applications in which optical performance requires low haze and high visible light transmission. For example, such a display comprises: (a) a first electrode comprising the transparent electrode, wherein the transparent substrate comprises a first substrate; (b) a second substrate; and (c) image forming material disposed between the polymeric overcoat layer and the second substrate. In some embodiments, the second substrate is transparent. In some embodiments, the second substrate is opaque. Exemplary displays in which the transparent electrode may be used include polymer-dispersed liquid crystal displays, liquid crystal displays, electrophoretic displays, electrochromic displays, thermochromic displays, electroluminescent displays and plasma displays.

These and other aspects of the invention are described in the detailed description below. In no event should the above summary be construed as a limitation on the claimed subject matter which is defined solely by the claims as set forth herein.

BRIEF DESCRIPTION OF THE DRAWINGS

The invention may be more completely understood in consideration of the following detailed description in connection with the following figures.

DETAILED DESCRIPTION

Transparent electrodes suitable for use in displays often include indium tin oxide (ITO) as the conductive material. However, transparent electrodes comprising ITO have a number of drawbacks including brittleness which can lead to handling difficulties on flexible substrates, and a high refractive index that can give rise to reflective losses in constructions utilizing ITO layers on polymer films. The latter is a particular problem for liquid crystal-based displays, in that reflective losses at the electrode/active layer interface can lead to decreases in transmission, in turn leading to lower contrast ratios and degradation of display performance. Furthermore, a transparent electrode with ITO as conductive material is made by depositing ITO on a substrate using vacuum deposition, and this method is associated with high cost and specialized equipment that is not readily available.

Transparent electrodes made with silver as the conductive material are known. Silver can be utilized as a transparent conductive material when used in the form of silver nanowires, meshes or lines, as described in WO 2008/046058 (Allemand et al.). Although silver coatings provide excellent conductivity with high visible light transmission and low haze, in some applications the oxidative and chemical instability of silver, particularly in nanowire form, can necessitate the use of a protective overcoat for the silver layer. The protective overcoat can protect the silver from mechanical damage and environmental degradation which can lead to loss of conductivity of the silver.

Protective overcoats for silver include those having insulating electrical properties. A protective overcoat is considered to have insulating electrical properties if a coating of the protective overcoat on the substrate, without the silver nanowires, has a sheet resistance greater than about $10^{12}$ ohm/sq. Materials such as UV-curable acrylic resins have insulating properties and are particularly useful for making protective overcoats.

Protective overcoats for silver include those having conducting properties. A protective overcoat is considered to have conducting properties if a coating of the protective overcoat on the substrate, without the silver nanowires, has a sheet resistance less than about $10^4$ ohm/sq. Materials useful for making a protective overcoat having conducting properties include various types of vacuum-applied coatings comprising ITO, but this approach is not advantageous for reasons described above for ITO itself. Conducting protective overcoats can also include conducting polymers but these materials absorb strongly in the visible region. For example, poly(3,4-ethylenedioxythiophene) poly(styrene sulfonate) (often referred to as PEDOT/PSS) is widely used yet it is deep blue.

This disclosure describes a transparent electrode comprising metallic nanowires disposed on a transparent substrate to form a conductive layer, and a polymeric overcoat layer is disposed on the conductive layer. The polymeric overcoat layer comprises nanoparticles dispersed in a polymer, the nanoparticles selected from the group consisting of antimony tin oxide (ATO), zinc oxide and ITO, and the layer has a sheet resistance greater than about $10^7$ ohm/sq, for example, from about $10^7$ to about $10^{12}$ ohm/sq.

Surprisingly, it has been discovered that the polymeric overcoat layer disclosed herein can improve the optical performance of a display. For example, PDLC displays having a polymeric overcoat layer disclosed herein can exhibit a decrease in haze in the on state relative to that observed for comparative PDLC displays having other types of polymeric overcoat layers. Typically the on state of a PDLC display is measured at a potential of 64V or less, and the decrease in haze can be observed for the display at a potential of 32V, as well as at 64V. In many cases, visible light transmission is high, for example, at least about 80%.

One measure of the effectiveness of a PDLC display is given by the difference in haze between the off and on states, which is desired to be as large as possible. High visible light transmission is also a benefit. The transparent electrodes disclosed herein can provide a larger difference in haze relative to electrodes using the insulating overcoats of the prior art, as well as improved transmission over ITO electrodes.

Figure 1:
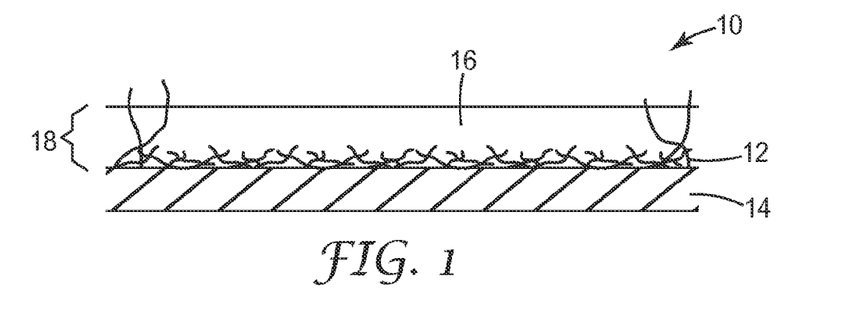
FIG. 1 shows a cross-sectional view of an exemplary transparent electrode.

FIG. 1 shows a cross-sectional view of an exemplary transparent electrode disclosed herein. Transparent electrode 10 comprises conductive layer 12 disposed on transparent substrate 14, and polymeric overcoat layer 16 is disposed on the conductive layer. Polymeric overcoat layer 16 and conductive layer 12 form polymeric nanowire layer 18. The transparent electrode is transparent, meaning that it is substantially optically clear such that when viewing an object on an opposing side of the electrode, little or no distortion of the object is observed, or some acceptable level of distortion is observed. Transparent electrode 10 may be flexible such that it can be flexed without loss of conductive properties, to provide a display that is conformable to a curved surface.

In some embodiments, the transparent electrode exhibits little or no haze, meaning it may have a haze value not greater than about 10%, not greater than about 5% or not greater than about 2%. For light normally incident on the transparent electrode, the haze value is the ratio of transmitted light that deviates from the normal direction by more than 4 degrees to the total transmitted light. Haze values disclosed herein were measured using a Haze-Gard Plus haze meter (BYK-Gardiner, Silver Springs, Md.) according to the procedure described in ASTM D1003.

In some embodiments, the transparent electrode has high light transmittance of from about 80 to about 100%, from about 90 to about 100%, from about 95 to about 100%, or from about 98 to about 100% over at least a portion of the visible light spectrum (about 400 to about 700 nm). In some embodiments, the transparent electrode has a high light transmittance of at least about 80%, from about 90 to about 100%, or from about 90 to about 95% over at least a portion of the visible light spectrum (about 400 to about 700 nm), and a haze value from about 0.01 to less than about 5%.

The conductive layer comprises metallic nanowires which can be characterized as having an aspect ratio greater than about 10, the aspect ratio determined by dividing the length of the particles by their diameter. As used herein, metallic nanowire refers to a metallic wire comprising metal, metal alloys or metal compounds including metal oxides. At least one cross-sectional dimension of the metallic nanowire is less than 500 nm, less than 200 nm or preferably less than 100 nm. The aspect ratio is greater than about 10, greater than about 50, greater than about 100 or from about 10 to about 100,000. Metallic nanowires can comprise any metal including silver, gold, copper, nickel and gold-plated silver. In one embodiment, the metallic nanowires comprise silver nanowires as described, for example, in WO 2008/046058 (Allemand et al.). Silver nanowires can be prepared as described in WO 2008/046058 or obtained from commercial sources such as Blue Nano (Charlotte, N.C.), Seashell (La Jolla, Calif.), and Nanogap USA (San Francisco, Calif.).

The metallic nanowires form a conductive network on the surface of the transparent substrate. In general, a dispersion of the metallic nanowires in some solvent is prepared and coated on the transparent substrate, followed by drying the coating to remove the solvent. Any solvent that forms a stable dispersion with the metallic nanowires can be used, for example, water, alcohols, ketones, ethers, hydrocarbons, aromatic hydrocarbons, and compatible mixtures thereof. The dispersion comprising the metallic nanowires can comprise additives typically used in coating formulations, for example, surfactants, binders, materials for controlling viscosity, corrosion inhibitors, etc. Optimization of dispersion formulations and coating and drying conditions is described in Allemand et al.

In general, the thickness of the conductive layer depends upon the particular metallic nanowires being used, properties of the polymeric overcoat layer, the imaging material, etc. In most cases, it is desirable to minimize the amount of metallic nanowires used in order to minimize cost and any adverse effects on the performance of the display. The conductive layer may comprise a variety of components in addition to the metallic nanowires. In one embodiment, the conductive layer consists essentially of the metallic nanowires. In another embodiment, the conductive layer comprises greater than about 40 wt % of the metallic nanowires, with the remaining wt % comprising additives such as binders and surfactants.

The thickness of the conductive layer is less than about 500 nm. In some embodiments, the conductive layer is in the form of a mesh or network of nanowires or in some discontinuous form across a surface of the transparent substrate. In some embodiments, the metallic nanowires are disposed on the transparent substrate such that they form a pattern comprising transparent conductive regions and transparent non-conductive regions. An exemplary pattern comprises an array of lines or discrete conductive regions spaced apart from each other by about 5 to about 500 um or more.

In most cases, the particular metallic nanowires used and the thickness of the conductive layer is determined by the desired sheet resistance of the layer disposed on the transparent substrate. The typical range of sheet resistance is from about 10 ohm/sq to about 5000 ohm/sq, with preferred ranges depending on the particular device and application. For organic light-emitting diode (OLED) devices, preferred sheet resistance is from about 10 to about 50 ohm/sq; for PDLC and cholesteric liquid crystal devices, preferred sheet resistance is from about 50 to about 250 ohm/sq; and for electrophoretic display devices, preferred sheet resistance is from about 50 to about 2000 ohm/sq.

Sheet resistance of the conductive layer can be measured by contact and non-contact methods. For the contact method, a two-point probe comprising two metal contacts connected to a voltmeter is placed on the conductive layer such that the probe is in contact with layer. For the non-contact method, an instrument having a contactless probe may be used, for example, the Delcom 727R Non-Contact Conductance Monitor from Delcom Products Inc.

The transparent electrode can be used in different types of displays as described below. In some displays, the transparent electrode needs to be designed such that light is transmitted through the electrode and toward the viewer. In these cases, the components and thickness of the conductive layer need to be selected such that optical properties of the layer meet certain requirements.

The polymeric overcoat layer is disposed on the conductive layer such that the metallic nanowires are protected from adverse environmental factors such as corrosion and abrasion. In particular, the polymeric overcoat layer may be designed to prevent or at least minimize the permeability of corrosive elements, such as moisture, trace amounts of acid, oxygen, sulfur and the like.

In general, the polymeric overcoat layer is formed from organic components which may or may not be pre-polymerized. The organic components are not particularly limited as long as the polymeric overcoat layer incorporating the nanoparticles can be formed on the conductive layer, and the conductive layer is protected from corrosion and abrasion yet can function as desired in the resulting display.

In some embodiments, the polymeric overcoat layer is formed from a polymerizable formulation comprising one or more polymerizable components such as monomers which can include small molecules having a molecular weight less than about 500 g/mole, oligomers having a molecular weight of greater than 500 to about 10,000 g/mole, and polymers having a molecular weight of greater than 10,000 to about 100,000 g/mole. The polymerizable monomers or oligomers can be cured using actinic radiation, e.g., visible light, ultraviolet radiation, electron beam radiation, heat and combinations thereof, or any of a variety of conventional anionic, cationic, free radical or other polymerization techniques, which can be photochemically, thermally or redox initiated. Polymerization may be carried out using solvent polymerization, emulsion polymerization, suspension polymerization, bulk polymerization, and the like.

Representative examples of polymerizable groups suitable for forming the polymeric overcoat layer include epoxy groups, ethylenically unsaturated groups, allyloxy groups, (meth)acrylate groups, (meth)acrylamide groups, cyanoester groups, vinyl ether groups, combinations thereof, and the like. The monomers may be mono- or multifunctional and capable of forming a crosslinked network upon polymerization. As used herein, (meth)acrylate refers to acrylate and methacrylate, and (meth)acrylamide refers to acrylamide and methacrylamide.

Useful monofunctional monomers include styrene, alpha-methylstyrene, substituted styrene, vinyl esters, vinyl ethers, N-vinyl-2-pyrrolidone, (meth)acrylamide, N-substituted (meth)acrylamide, octyl (meth)acrylate, iso-octyl (meth)acrylate, nonylphenol ethoxylate (meth)acrylate, isononyl (meth)acrylate, diethylene glycol mono(meth)acrylate, isobornyl (meth)acrylate, 2-(2-ethoxyethoxy)ethyl (meth) acrylate, 2-ethylhexyl (meth)acrylate, lauryl (meth)acrylate, butanediol mono(meth)acrylate, beta-carboxyethyl (meth) acrylate, isobutyl (meth)acrylate, cycloaliphatic epoxide, 2-hydroxyethyl (meth)acrylate, (meth)acrylonitrile, maleic anhydride, itaconic acid, isodecyl (meth)acrylate, dodecyl (meth)acrylate, n-butyl (meth)acrylate, methyl (meth)acrylate, hexyl (meth)acrylate, (meth)acrylic acid, N-vinylcaprolactam, stearyl (meth)acrylate, hydroxyl functional polycaprolactone ester (meth)acrylate, hydroxypropyl (meth) acrylate, hydroxyisopropyl (meth)acrylate, hydroxybutyl (meth)acrylate, hydroxyisobutyl (meth)acrylate, tetrahydrofurfuryl (meth)acrylate, combinations thereof, and the like.

Suitable high molecular weight constituents comprising polymerizable oligomers and polymers may be incorporated into the polymeric overcoat layer for providing durability, flexibility, adhesion to the conductive layer and/or transparent substrate, weatherability, permeability, etc. These high molecular weight constituents may also be useful for obtaining a suitable coating formulation for forming the polymeric overcoat layer, for example, they may be used to provide viscosity control or reduce shrinkage of the layer upon curing. The oligomers and/or polymers themselves may be straight-chained, branched, and/or cyclic. Branched oligomers and/or polymers tend to have lower viscosity than straight-chain counterparts of comparable molecular weight.

Exemplary polymerizable oligomers and polymers include aliphatic polyurethanes, (meth)acrylates, polyesters, polyimides, polyamides, epoxy polymers, polystyrene (including copolymers of styrene) and substituted styrenes, silicone-containing polymers, fluorinated polymers, combinations thereof, and the like. For some applications, polyurethane (meth)acrylate oligomers and/or polymers can have improved durability and weatherability characteristics. Such materials also tend to be readily soluble in reactive diluents formed from radiation curable monomers, particularly (meth)acrylate monomers. Exemplary polymerizable oligomers and polymers include combinations of the above-described functionalities such as urethane (meth)acrylates, epoxy (meth)acrylates, polyester (meth)acrylates, polyether (meth)acrylates, (meth)acrylated (meth)acrylics, (meth) acrylated silicones, vinyl (meth)acrylates, and (meth)acrylated oils.

The polymeric overcoat layer can also be formed from organic components which are not polymerizable, particularly polymers which are simply combined with the nanoparticles in some aqueous and/or organic solvent-based formulation and coated over the conductive layer, followed by removal of any volatiles to form the polymeric overcoat layer. Exemplary polymers include poly(meth)acrylates, polystyrenes, polyurethanes, poly(vinylalcohol) copolymers and polyesters.

Particular examples of monofunctional monomers include those described above. Particular examples of multifunctional monomers include pentaerythritol triacrylate (SR 444C from Sartomer Co.), hexanediol diacrylate, urethane acrylate oligomers (CN 981 B88 from Sartomer Co.) and Ucecoat® 7655 and 7689 from Cytec Industries.

Particular examples of preformed polymers include polymethylmethacrylates (for example Elvacite® 2041 available from Lucite International, Inc.), polystyrenes, and polyvinylbutyrals (for example Butvar® polymers available from Solutia Inc.).

In some embodiments, the polymeric overcoat layer comprises the reaction product of a multifunctional (meth)acrylate. For example, the polymeric overcoat layer may comprise a methyl (meth)acrylate polymer and the reaction product of a multifunctional (meth)acrylate. For another example, the polymeric overcoat layer may comprise the reaction product of a multifunctional (meth)acrylate and a urethane (meth)acrylate oligomer.

The polymeric overcoat layer comprises nanoparticles having a diameter of less than about 500 nm, from about 10 to about 500 nm or from about 40 to about 200 nm, and selected from the group consisting of ATO, zinc oxide and ITO. These metal oxide nanoparticles can be prepared by hydrothermal synthetic methods or obtained from commercial sources such as Advanced Nano Products (Korea), Sukgyung AT Inc. (Des Plaines, Ill.), and Evonik Degussa Corp. (Parsippany, N.J.).

The polymeric overcoat layer comprises the organic components and nanoparticles in any relative amount as long as the desired properties and performance of the layer are obtained. In general, the weight ratio of organic components to nanoparticles may be from about 85:15 to about 25:75, and preferably from about 75:25 to about 40:60.

The thickness of the polymeric overcoat layer is not particularly limited as long as the layer protects the metallic nanowires from corrosion and abrasion, and the desired properties and performance of the layer are obtained. In general, the thickness of the polymeric overcoat layer is less than about 1 um, preferably from about 50 nm to about 1 um. In some embodiments, as shown in FIG. 1, the polymeric overcoat layer may be disposed on the conductive layer such that portions of the metallic nanowires protrude from the surface of the polymeric overcoat layer to enable access to the conductive layer. In some embodiments, the metallic nanowires do not protrude from the surface of the polymeric overcoat layer, and the conductive layer is accessed through an opening in the polymeric overcoat or an opening at an edge of the transparent electrode. In some embodiments, the metallic nanowires do not protrude from the surface of the polymeric layer, and the conductive layer is accessed through thin portions of the polymeric overcoat layer.

In general, the particular components and amounts, layer thickness, etc. of the polymeric overcoat layer will depend upon any number of factors, for example, the chemistry of the organic components, the nanoparticles, the metallic nanowires being used, the amount of metallic nanowires present in the conductive layer, the thickness of the conductive layer, the imaging material and the type of display in which the transparent electrode is used.

In some embodiments, the polymeric overcoat layer comprises an optically clear layer having high light transmittance of from about 80 to about 100%, from about 90 to about 100%, from about 95 to about 100%, or from about 98 to about 100% over at least a portion of the visible light spectrum (about 400 to about 700 nm). In some embodiments, the polymeric overcoat layer has a haze value of less than about 5%, less than about 3%, or less than about 1%. In some embodiments, the polymeric overcoat layer has a haze value of from about 0.1 to less than about 5%, from about 0.1 to less than about 3%, or from about 0.1 to less than about 1%.

The polymeric overcoat layer is selected depending on the desired properties of the layer, the transparent electrode and the display into which it is incorporated. The coating formulation for the polymeric overcoat layer is coated directly on the transparent substrate without the conductive layer, and curing, drying etc. are carried out to form the polymeric overcoat layer. Performance of the polymeric overcoat layer is then determined by measuring the sheet resistance of the coated transparent substrate. A sheet resistance of the polymeric overcoat layer disposed on the transparent substrate without the conductive layer should be greater than about $10^7$ ohm/sq. In some embodiments, the sheet resistance is from about $10^7$ to about $10^{12}$ ohm/sq. For a given polymeric overcoat layer, the sheet resistance can be varied by changing the thickness of the layer, and the layer can be as thin as desired, as long as the metallic nanowires are protected from corrosion and abrasion. Sheet resistance of the polymeric overcoat layer can be measured by contact and non-contact methods as described above.

The effectiveness of the polymeric overcoat layer as a protective layer for the conductive layer can be determined using accelerated weathering testing. These tests are carried out by preparing a transparent electrode comprising a conductive layer disposed thereon, and a given polymeric overcoat is disposed on the conductive layer. The transparent electrode is exposed to conditions of 85° C./dry and 85° C./85% relative humidity. An effective polymeric overcoat layer gives a sheet resistance increase of less than about 50 to 100% of the initial value after 1000 hr of accelerated testing. Sheet resistance of the transparent electrode (with conductive layer and polymeric overcoat layer) can be measured by contact and non-contact methods as described above.

In some embodiments, the transparent substrate is transparent, meaning that it is substantially optically clear such that when viewing an object on an opposing side of the substrate, little or no distortion of the object is observed, or some acceptable level of distortion is observed. In some embodiments, the transparent substrate exhibits little or no haze, meaning it may have a haze value not greater than about 10%, not greater than about 5% or not greater than about 2%. In some embodiments, the transparent substrate has high light transmittance of from about 80 to about 100%, from about 90 to about 100%, from about 95 to about 100%, or from about 98 to about 100% over at least a portion of the visible light spectrum (about 400 to about 700 nm). In some embodiments, the transparent substrate has a high light transmittance of at least about 80%, from about 90 to about 100%, or from about 90 to about 95% over at least a portion of the visible light spectrum (about 400 to about 700 nm), and a haze value from about 0.1 to less than about 5%. The transparent substrate can be reflective, antireflective, polarizing, non-polarizing, colored (transmissive to particular wavelengths of light) or some combination thereof.

The transparent substrate can comprise any useful material such as, for example, polymer, glass, ceramic, metal, metal oxide, or a combination thereof. Examples of polymers that may be used as the transparent substrate include thermoplastic polymers such as polyolefins, poly(meth)acrylates, polyamides, polyimides, polycarbonates, polyesters, and biphenyl- or naphthalene-based liquid crystal polymers. Further examples of useful thermoplastics include polyethylene, polypropylene, polystyrene, poly(methylmethacrylate), bisphenol A polycarbonate, poly(vinyl chloride), polyethylene terephthalate, polyethylene naphthalate, cellulose acetates and poly(vinylidene fluoride). Some of these polymers also have optical properties (e.g., transparency) that make them especially well-suited for certain display applications wherein they would support a patterned conductor, such as polycarbonates, polyimides, and/or polyesters.

The transparent substrate may have any useful thickness, ranging from about 5 μm to about 1000 μm, from about 25

μm to about 500 μm, from about 50 μm to about 250 μm, or from about 75 μm to about 200 μm. In cases where the transparent substrate is glass, the thickness can be up to 250 um or greater.

The transparent substrate can be flexible such that it can be flexed or wound around a cylindrical mandrel of specified diameter without cracking or breaking The transparent substrate may be rigid. In some embodiments, the transparent substrate has sufficient mechanical properties such as strength and flexibility to be processed on a roll-to-roll apparatus wherein a material is wound onto or unwound from a support, as well as further processed in some way. Examples of further processing include coating, slitting, laminating, and exposing to radiation, or the like.

The transparent substrate can include multiple layers of material such as a support layer, a primer layer, a hard coat layer, a decorative design, and the like. The transparent substrate can be permanently or temporarily attached to an adhesive layer. For example, the transparent substrate can have an adhesive layer on a major surface thereof, and a release liner can be disposed on the adhesive layer and removed for attachment of the adhesive layer to another substrate.

The polymeric nanowire layer (e.g. layer 18 described above) can be disposed on a multilayer substrate designed to function as a barrier film in displays such as electrophoretic and organic light-emitting diode (OLED) devices. In general, barrier films have specific oxygen and water transmission rates at a specified level as required by the application in which the film is used. For example, the polymeric nanowire layer can be used in a flexible multilayer construction comprising alternating organic and inorganic layers disposed on a substrate. Flexible multilayer constructions of this type are described in US2010/0073936 A1 and US2010/0195967 A1 (both to Padiyath et al.) and US 2010/0272933 A1 (McCormick et al.); the disclosures of which are incorporated herein by reference.

Figure 4A:
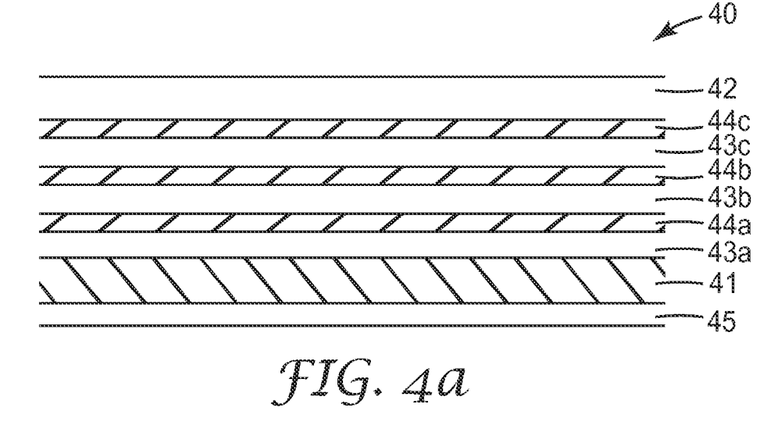
FIGS. 4a and 4b show cross-sectional views of exemplary barrier film assemblies.

FIG. 4a shows a schematic cross-section of an exemplary barrier electrode assembly. Barrier electrode assembly 40 comprises support 41, outer polymeric layer 42, and a plurality of alternating polymeric 43a-c and inorganic layers 44a-c disposed between the substrate and the outer polymeric layer. Disposed on support 41, opposite outer polymeric layer 42, is polymeric nanowire layer 45. The polymeric nanowire layer comprises a conductive layer disposed on support 41 and comprises metallic nanowires. The polymeric nanowire layer also comprises a polymeric overcoat layer disposed on the conductive layer and comprising nanoparticles selected from the group consisting of antimony tin oxide, zinc oxide and indium tin oxide, wherein a sheet resistance of the polymeric overcoat layer disposed on a transparent substrate without the conductive layer is greater than about $10^7$ ohm/sq.

Figure 4B:
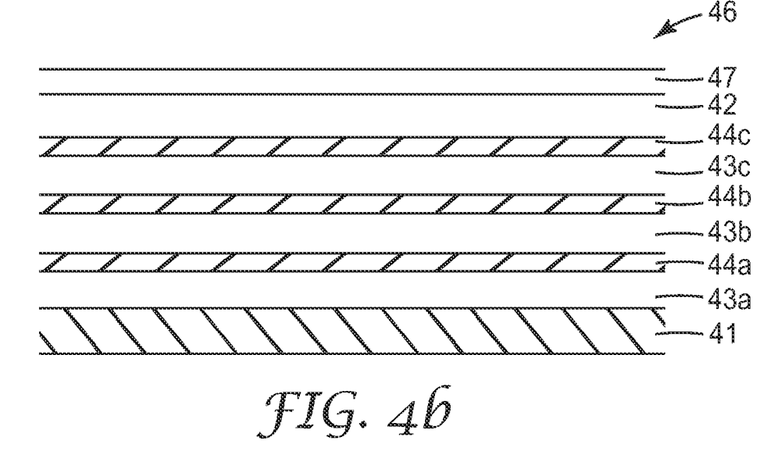

FIG. 4b shows s schematic cross-section of another exemplary barrier electrode assembly. Barrier electrode assembly 46 comprises support 41, outer polymeric layer 42, and a plurality of alternating polymeric 43a-c and inorganic layers 44a-c disposed between the substrate and the outer polymeric layer. Disposed on outer polymeric layer 42, opposite support 41 is polymeric nanowire layer 47. The polymeric nanowire layer comprises a conductive layer disposed on outer polymeric layer 42 and comprises metallic nanowires. The polymeric nanowire layer also comprises a polymeric overcoat layer disposed on the conductive layer and comprising nanoparticles selected from the group consisting of antimony tin oxide, zinc oxide and indium tin oxide, wherein a sheet resistance of the polymeric overcoat layer disposed on a transparent substrate without the conductive layer is greater than about $10^7$ ohm/sq.

Materials which may be used for support 41 include polyesters such as PET and PEN, poly(meth)acrylates, polycarbonate, silicon, epoxy resins and others as described in the Padiyath et al. and McCormick et al. references. The outer polymeric layer and the plurality of alternating polymeric layers are typically layers formed by polymerization of oligomers and monomers, as described in the Padiyath et al. and McCormick et al. references. The inorganic layers can be metals, metal oxides, metal nitrides, metal carbides and the like, as described in the Padiyath et al. and McCormick et al. references. The polymeric layers can be different from each other, and the inorganic layers can be different from each other. Layer thicknesses, properties and the like are also described in Padiyath et al. and McCormick et al. references.

The transparent electrode disclosed herein can be used to make a variety of electronic displays that deliver light in the form of information and/or an image toward a viewer. In general, a display comprises: a first electrode comprising the transparent electrode described above, wherein the transparent substrate is a first substrate; a second substrate; a second electrode disposed on either the first or second substrates; and image forming material disposed between the polymeric overcoat layer and the second substrate.

The transparent electrode can be used to make a transmissive display in which pixels are illuminated from behind, typically using a backlight, such that an image is observed by a viewer positioned in front of the display. For transmissive displays, the second substrate and the second electrode are transparent.

Figure 2:
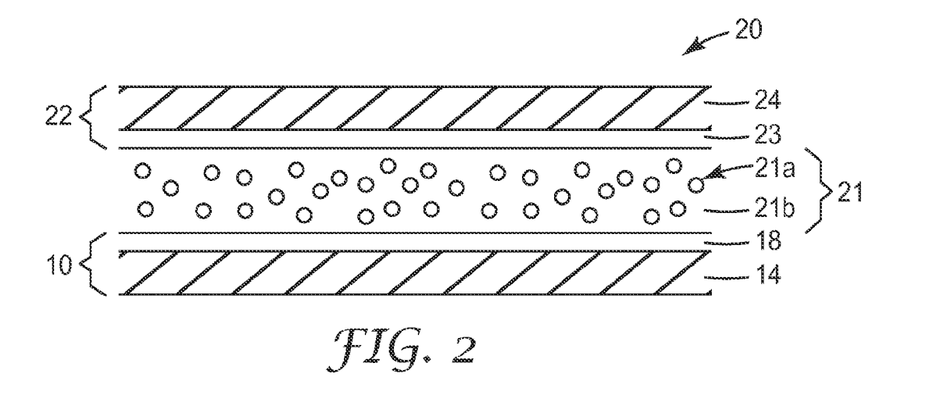
FIG. 2 shows a cross-sectional view of an exemplary transmissive display comprising the transparent electrode disclosed herein.

FIG. 2 shows a cross-sectional view of an exemplary transmissive display comprising the transparent electrode disclosed herein. Transmissive display 20 is a PDLC display and includes imaging material 21 comprising droplets of liquid crystalline polymer 21a dispersed in polymer matrix 21b. The imaging material is disposed in a cell gap formed between opposing first and second transparent electrodes, 10 and 22, respectively. First transparent electrode 10 comprises polymeric-overcoated nanowire layer 18 disposed on transparent substrate 14 also referred to as a first transparent substrate, and second transparent electrode 22 comprises second conductive layer 23 disposed on second transparent substrate 24.

In some embodiments of the PDLC display shown in FIG. 2, the first and second transparent electrodes are the same, i.e., second conductive layer 23 is the same as polymeric nanowire layer 18, and second transparent substrate 24 is the same as first transparent substrate 14. In some embodiments, the first and second transparent electrodes are not the same, i.e., second conductive layer 23 can consist essentially of ITO traces on second transparent substrate 24, and the second transparent substrate can be the same as the first transparent substrate. The viewer may be disposed on either side of the display depending upon the overall design of the display and the device in which it is used.

In some embodiments, second transparent electrode 22 is not included as part of a transmissive display if, for example, the first transparent electrode is applied to a window.

As described above, imaging material used in PDLC devices comprises droplets of liquid crystalline polymer dispersed in a polymer matrix. This imaging material can be prepared between a pair of transparent electrodes by combining the liquid crystal material with a polymerizable matrix precursor (such as one or more UV-curable monomers) and then subjecting the mixture to polymerization conditions. This causes phase separation of the liquid crystal material, resulting in formation of liquid crystal droplets dispersed throughout the polymerized matrix. Exemplary materials which may be used are described in U.S. Pat. No. 5,641,426 (Nerad et al.) and U.S. Pat. No. 5,867,238 (Miller et al.). The imaging material used in PDLC displays can also be provided in the form of a film having a thickness of about 5 to about 25 um.

PDLC displays function by applying an electric field across the imaging material such that a change in orientation of the dispersed liquid crystal droplets takes place. In one embodiment, the imaging material is translucent or hazy in the off state due to light scattering by the dispersed droplets, and when the electric field is applied, a refractive index mismatch between the liquid crystalline droplets and the polymeric matrix decreases such that the imaging material becomes transparent or substantially transparent. The first and second transparent electrodes are connected to a power supply by leads (not shown) for generating the electric field.

The transparent electrode can be used to make a reflective display in which pixels are illuminated from the front, typically by ambient light, such that an image is observed by a viewer positioned on the same side of the display.

Figure 3:
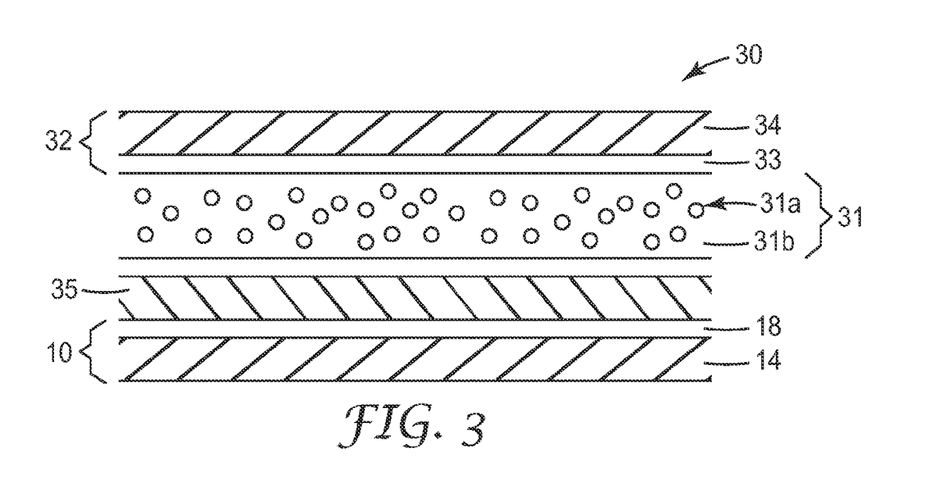
FIG. 3 shows a cross-sectional view of an exemplary reflective display comprising the transparent electrode disclosed herein.

FIG. 3 shows a cross-sectional view of an exemplary reflective display comprising the transparent electrode disclosed herein. Reflective display 30 is an electrophoretic display and includes imaging material 31. The imaging material is disposed in a cell gap formed between opposing first transparent electrodes 10 and 32, respectively. First transparent electrode 10 comprises polymeric nanowire layer 18 disposed on transparent substrate 14. Reflective scattering layer 35 is disposed on the polymeric nanowire layer. Second transparent electrode 32 comprises second conductive layer 33 disposed on second transparent substrate 34.

For the embodiment shown in FIG. 3, the viewer is positioned in front of transparent electrode 32 (on the side opposite the imaging material) and light enters the display through the front, i.e., through the second transparent electrode 32. This light then reflects off the reflective scattering element 35 (described below) or off of particles in active layer 31 (described below) and back through second transparent electrode 32 toward the viewer.

In some embodiments of the electrophoretic display shown in FIG. 3, the first and second transparent electrodes are the same, i.e., second conductive layer 33 is the same as polymeric nanowire layer 18, and second transparent substrate 34 is the same as first transparent substrate 14. In some embodiments, for instance, the first and second transparent electrodes are not the same, i.e., conductive layer 18 can consist essentially of ITO traces on second transparent substrate 14, wherein the second transparent substrate is the same as the first transparent substrate.

In some embodiments, an electrophoretic display comprises the display described for FIG. 3, except that transparent substrate 14 is replaced with some other substrate which does not have to meet optical properties such as transparency, transmissivity, haze, etc. as described above for the first transparent substrate. For example, this other substrate may be opaque to some degree, or substantially opaque. A substrate that is completely opaque is neither transparent nor translucent. Materials that make up this other substrate can be any of those described above for the first transparent substrate.

In general, electrophoretic displays are designed to mimic the appearance of ordinary ink on paper. In the simplest implementation of an electrophoretic display, imaging material 31 comprises a mixture of transparent microcapsules 31a dispersed in a fluid 31b such as hydrocarbon oil. The transparent microcapsules typically contain positively charged titanium oxide particles and negatively charged black pigment particles. Upon application of a voltage, the particles migrate electrophoretically to the front (viewing) side of the display which then appears white due to scattering of light. When the particles are located at the rear side of the display, it appears dark because incident light is absorbed by the black pigment. Thus, images are created by reflecting and absorbing regions. Electrophoretic displays are used in devices such as the Amazon Kindle, Barnes & Noble Nook and Sony Reader.

In general, reflective scattering layer 35 exhibits diffuse and/or specular reflection of incident light. The reflective scattering layer can be selected based on the distribution of light incident upon the layer, as well as the desired distribution of light reflected back toward the viewer. For example, a reflective scattering layer can be designed to reflect light such that the apparent brightness of the display in which it is used is similar regardless of the angle at which the display is viewed. The reflective scattering layer can include a wide variety of materials having a wide variety of reflecting surfaces. For example, the reflective scattering layer may comprise plaster, white paper, fibrous materials like non-woven fiber mats and cloth, inorganic filled white reflective polymers (inorganic particle filled polymers such as polyesters, polyolefins, and the like), ceramic materials, crystalline surfaces (for example marble, natural quartz or stone), metals and voided polymer materials. In one particular example, the reflective scattering layer comprises an enhanced specular reflector such as multilayer optical film available as Vikuiti™ ESR from 3M Co., the film having a diffuse coating on a surface thereof.

The transparent electrode can be used to make other types of displays such as an electrochromic display. The imaging material used in an electrochromic display typically comprises a material or species that exhibits electrochromism, a phenomenon wherein reversible color changes occur when electric current is applied. Exemplary electrochromic materials include polyanilines, viologens, polyoxotungstates, tungsten oxide, ruthenium (II) complexes, particle-bound dyes, and polypyridyl complexes.

Other types of displays that can be made using the transparent electrode disclosed herein include liquid crystal displays which use the light modulating properties of liquid crystals. The imaging material used in liquid crystal displays may comprise any type of material that exhibits liquid crystallinity. In some embodiments, the imaging material comprises cholesteric liquid crystals which are chiral in nature (e.g., molecules that do not possess a mirror plane) and molecular units that are mesogenic in nature (e.g., molecules that exhibit liquid crystal phases). Cholesteric liquid crystal materials can be polymers. Cholesteric liquid crystal materials may also include achiral liquid crystal compounds (nematic) mixed with or containing a chiral unit. Cholesteric liquid crystal materials include compounds having a cholesteric liquid crystal phase in which the director (the unit vector that specifies the direction of average local molecular alignment) of the liquid crystal rotates in a helical fashion along the dimension perpendicular to the director. Cholesteric liquid crystal materials are also referred to as chiral nematic liquid crystal materials. The pitch of the cholesteric liquid crystal material is the distance (in a direction perpendicular to the director and along the axis of the cholesteric helix) that it takes for the director to rotate through 360 degrees. This distance is generally 100 nm or more.

Other types of displays that can be made using the transparent electrode disclosed herein include electrofluidic displays such as an electrowetting display, a relatively new technology, originally described in "Video-Speed Electronic Paper Based on Electrowetting" by R. A. Hayes and B. J. Feenstra in *Nature*, Vol. 425, 383-385 (25 Sep. 2003) and developed by Liquavista BV. Electrowetting displays comprise a transparent electrode, hydrophobic insulator, a colored oil layer and water, sandwiched between glass or polymeric substrates. In equilibrium the colored oil naturally forms a stable continuous film between the water and the hydrophobic insulator. When a voltage difference is applied across the hydrophobic insulator, the system lowers its energy by moving the water into contact with the insulator, thereby displacing the oil and exposing the underlying reflecting surface. The balance between electrostatic and surface tension forces determines how far the oil is moved to the side. In this way the optical properties of the stack when viewed from above can be continuously tuned between a colored off-state and a transparent on-state, provided the pixel is sufficiently small so that the eye averages the optical response.

Another example of an electrofluidic display are electrofluidic displays made using "Young-Laplace Transposition of Brilliant Pigment Dispersions" described by J. Heikenfeld et al. in *Nature Photonics, Vol.* 3, 292-296 (26 Apr. 2009). The technology is being developed by Gamma Dynamics. The technology is a three dimensional microfluidic display device that provides a direct view of brilliantly coloured pigment dispersions. The basic electrofluidic structure has several important geometrical features. The first is a reservoir that will hold an aqueous pigment dispersion in less than 5-10% of the visible area. The second feature is a surface channel occupying 80-95% of the visible area; this receives the pigment dispersion from the reservoir when a suitable stimulus is applied. Third, there is a duct surrounding the device that enables counterflow of a nonpolar fluid (oil or gas) as the pigment dispersion leaves the reservoir. It is important to note that all of these features are inexpensively formed in a single photolithographic or microreplication step. Several additional coatings and a top substrate are added to the reservoir structure. The surface channel is first bound by two electrowetting plates consisting of an electrode and hydrophobic dielectric. The top electrowetting plate is composed of a transparent conducting electrode so that the surface channel may be viewed by the naked eye. The bottom electrowetting plate comprises a highly reflective electrode made from aluminium, for example. With this arrangement, when no voltage is applied, a net Young-Laplace pressure causes the pigment dispersion to occupy the cavity, which imparts a larger radius of curvature on the pigment dispersion. Therefore at equilibrium, the pigment dispersion occupies the reservoir and is largely hidden from view. This is analogous to connecting two soap bubbles by a straw—the larger bubble has a larger radius of curvature and a lower Young-Laplace pressure, and will therefore consume the smaller bubble. When a voltage is applied between the two electrowetting plates and the pigment dispersion, an electromechanical pressure is induced that exceeds the net Young-Laplace pressure, and the pigment dispersion is pulled into the surface channel. If the volume of the pigment dispersion is slightly greater than the volume of the surface channel, then the pigment will be simultaneously viewable in both the reservoir and the surface channel, and nearly the entire device area will exhibit the coloration of the pigment. If the voltage is removed the pigment dispersion rapidly (milliseconds to tens of milliseconds) recoils into the reservoir. Thus a switchable device is created that can hide the pigment or reveal the pigment with a visual brilliance that is similar to pigment printed on paper.

Embodiments

Among the embodiments disclosed herein are those particularly described below.

Embodiment 1. A transparent electrode comprising:
 a transparent substrate,
 a conductive layer disposed on the transparent substrate and comprising metallic nanowires,
 a polymeric overcoat layer disposed on the conductive layer and comprising nanoparticles selected from the group consisting of antimony tin oxide, zinc oxide and indium tin oxide, wherein a sheet resistance of the polymeric overcoat layer disposed on the transparent substrate without the conductive layer is greater than about $10^7$ ohm/sq.

Embodiment 2. The transparent electrode of Embodiment 1, wherein the sheet resistance of the polymeric overcoat layer disposed on the transparent substrate without the conductive layer is from about $10^7$ to about $10^{12}$ ohm/sq.

Embodiment 3. The transparent electrode of any preceding Embodiment, wherein the nanoparticles comprise antimony tin oxide or zinc oxide, and the sheet resistance of the polymeric overcoat layer disposed on the transparent substrate without the conductive layer is greater than about $10^{12}$ ohm/sq.

Embodiment 4. The transparent electrode of any preceding Embodiment, having a haze value less than about 5% and a visible light transmission of at least about 80%.

Embodiment 5. The transparent electrode of any preceding Embodiment, wherein the nanoparticles comprise antimony tin oxide and the polymeric overcoat layer is colorless.

Embodiment 6. The transparent electrode of any preceding Embodiment, wherein the polymeric overcoat layer comprises the reaction product of a multifunctional (meth)acrylate.

Embodiment 7. The transparent electrode of any preceding Embodiment, wherein the polymeric overcoat layer comprises a methyl (meth)acrylate polymer and the reaction product of a multifunctional (meth)acrylate.

Embodiment 8. The transparent electrode of any preceding Embodiment, wherein the polymeric overcoat layer the reaction product of a multifunctional (meth)acrylate and a urethane (meth)acrylate oligomer.

Embodiment 9. The transparent electrode of any preceding Embodiment, wherein the polymeric overcoat layer comprises a weight ratio of polymer to nanoparticles of about 85:15 to about 25:75.

Embodiment 10. The transparent electrode of any preceding Embodiment, wherein the electrode is flexible.

Embodiment 11. The transparent electrode of any preceding Embodiment, wherein the transparent substrate has a glass transition temperature greater than or equal to that of 70° C.

Embodiment 12. A barrier assembly comprising:
 a multilayer film assembly comprising a substrate, an outer polymeric layer, and a plurality of alternating polymeric and inorganic layers disposed between the substrate and the outer polymeric layer;
 a conductive layer disposed on the substrate and comprising metallic nanowires, a polymeric overcoat layer disposed on the conductive layer and comprising nanoparticles selected from the group consisting of antimony tin oxide, zinc oxide and indium tin oxide, wherein a sheet resistance of the polymeric overcoat layer disposed on the transparent substrate without the conductive layer is greater than about $10^7$ ohm/sq.

Embodiment 13. A barrier assembly comprising:
   a multilayer film assembly comprising a substrate, an outer polymeric layer, and a plurality of alternating polymeric and inorganic layers disposed between the substrate and the outer polymeric layer;
   a conductive layer disposed on the outer polymeric layer and comprising metallic nanowires,
   a polymeric overcoat layer disposed on the conductive layer and comprising nanoparticles selected from the group consisting of antimony tin oxide, zinc oxide and indium tin oxide, wherein a sheet resistance of the polymeric overcoat layer disposed on the transparent substrate without the conductive layer is greater than about $10^7$ ohm/sq.

Embodiment 14. The barrier assembly of Embodiment 12 or 13, wherein the sheet resistance of the polymeric overcoat layer disposed on the transparent substrate without the conductive layer is from about $10^7$ to about $10^{12}$ ohm/sq.

Embodiment 15. The barrier assembly of any of Embodiments 12-14, wherein the nanoparticles comprise antimony tin oxide or zinc oxide, and the sheet resistance of the polymeric overcoat layer disposed on the transparent substrate without the conductive layer is greater than about $10^{12}$ ohm/sq.

Embodiment 16. The barrier assembly of any of Embodiments 12-15, having a haze value less than about 5% and a visible light transmission of at least about 80%.

Embodiment 17. The barrier assembly of any of Embodiments 12-16, wherein the nanoparticles comprise antimony tin oxide and the polymeric overcoat layer is colorless.

Embodiment 18. The barrier assembly of any of Embodiments 12-17, wherein the polymeric overcoat layer comprises the reaction product of a multifunctional (meth) acrylate.

Embodiment 19. The barrier assembly of any of Embodiments 12-18, wherein the polymeric overcoat layer comprises a methyl (meth)acrylate polymer and the reaction product of a multifunctional (meth)acrylate.

Embodiment 20. The barrier assembly of any of Embodiments 12-19, wherein the polymeric overcoat layer the reaction product of a multifunctional (meth)acrylate and a urethane (meth)acrylate oligomer.

Embodiment 21. The barrier assembly of any of Embodiments 12-20, wherein the polymeric overcoat layer comprises a weight ratio of polymer to nanoparticles of about 85:15 to about 25:75.

Embodiment 22. The barrier assembly of any of Embodiments 12-21, wherein the barrier assembly is flexible.

Embodiment 23. A display for providing an image, comprising:
   (a) a first electrode comprising the transparent electrode of any of Embodiments 1-11, wherein the transparent substrate comprises a first substrate;
   (b) a second substrate;
   (c) image forming material disposed between the polymeric overcoat layer and the second substrate.

Embodiment 24. The display of Embodiment 23, wherein the second substrate is transparent.

Embodiment 25. The display of any of Embodiments 23-24, wherein the second substrate is opaque.

Embodiment 26. The display of any of Embodiments 23-25, wherein the sheet resistance of the polymeric overcoat layer disposed on the first substrate without the conductive layer is from about $10^7$ to about $10^{12}$ ohm/sq.

Embodiment 27. The display of any of Embodiments 23-26, wherein the nanoparticles comprise antimony tin oxide or zinc oxide, and the sheet resistance of the polymeric overcoat layer disposed on the first substrate without the conductive layer is greater than about $10^{12}$ ohm/sq.

Embodiment 28. The display of any of Embodiments 23-27, further comprising a second electrode and drive means for generating potential difference between the first and second electrodes such that the display switches from an off state to an on state.

Embodiment 29. The display of any of Embodiments 23-28, wherein the image forming material comprises liquid crystal droplets dispersed in a polymer matrix.

Embodiment 30. The display of any of Embodiments 23-29, wherein the image forming material comprises cholesteric liquid crystals.

Embodiment 31. The display of any of Embodiments 23-30, wherein the image forming material comprises electrophoretic material.

Embodiment 32. The display of any of Embodiments 23-31, wherein the image forming material comprises electrochromic material.

Embodiment 33. The display of any of Embodiments 23-32, wherein the display is flexible.

Embodiment 34. The display of any of Embodiments 23-33, wherein the display in the on state at a potential difference of about 32V has a haze value of less than about 40%.

Embodiment 35. The display of any of Embodiments 23-34, wherein the display in the on state at a potential difference of about 32V has a haze value of less than about 20%.

Embodiment 36. The display of any of Embodiments 23-35, wherein the nanoparticles are present in the polymeric overcoat layer at an amount that reduces a haze value of the display in the on state.

Embodiment 37. The display of any of Embodiments 23-36, wherein the display in the on state at a potential of at least about 32V has a visible light transmission of at least about 80%.

Embodiment 38. The display of any of Embodiments 23-37, wherein the nanoparticles are present in the polymeric overcoat layer at an amount that reduces a haze value and increases visible light transmittance of the display in the on state.

Embodiment 39. The display of any of Embodiments 23-38, wherein the nanoparticles comprise antimony tin oxide and the polymeric overcoat layer is colorless.

Embodiment 40. The display of any of Embodiments 23-39, wherein the polymeric overcoat layer comprises the reaction product of a multifunctional (meth)acrylate.

Embodiment 41. The display of any of Embodiments 23-40, wherein the polymeric overcoat layer comprises a methyl (meth)acrylate polymer and the reaction product of a multifunctional (meth)acrylate.

Embodiment 42. The display of any of Embodiments 23-41, wherein the polymeric overcoat layer comprises the reaction product of a multifunctional (meth)acrylate and a urethane acrylate oligomer.

Embodiment 43. The display of Z 23-42, wherein the polymeric overcoat layer comprises a weight ratio of polymer to nanoparticles of about 85:15 to about 25:75.

EXAMPLES

Materials

Materials used in the following examples are described in Table 1. All materials were used as received.

TABLE 1

| Abbreviation or Trade Name | Description |
|---|---|
| BL036 | liquid crystal material (EM Industries, Hawthorne, NY) |
| Micropearl SP210 | spacer beads/fine plastic spheres having 10 um particle diameter obtained from Sekisui Chemical Co. |
| VP AdNano ® LRC | UV curable coating solution with ITO nanoparticles 16% total solids (Evonik Degussa Corp., Parsippany, NJ) |
| ATO Sol | nominal 30 wt % ATO nanoparticles in IPA (Advanced Nano Products, Korea) |
| TC-ZnO Sol | nominal 20 wt % ZnO nanoparticles in IPA (Advanced Nano Products, Korea) |
| SR 444C | pentaerythritol triacrylate (Sartomer Co.) |
| CN 981 B88 | urethane acrylate oligomer (Sartomer Co.) |
| Elvacite ® 2041 | methyl methacrylate polymer (Lucite International, Inc.) |
| Irgacure ® 651 | photoinitiator (Ciba Specialty Chemicals) |
| Irgacure ® 819 | photoinitiator (Ciba Specialty Chemicals) |

Overcoat Compositions

Overcoat Composition OC-1

A concentrate was prepared by dissolving an 85:15 (w/w) mixture of SR 444 and Elvacite® 2041 in acetone to 10 wt % total solids. Irgacure® 651 was added at 0.2 wt % total solids. Coating solutions at 5 or 3 wt % solids were obtained by dilution into 1:1 (w/w) IPA:diacetone alcohol.

Overcoat Composition OC-2

A mixture of 20 parts Sartomer SR444C, 80 parts Sartomer CN981B88 and 1 part Irgacure® 819 was diluted to the desired solids level using 1:1 IPA:diacetone alcohol.

Overcoat Compositions OC-3, OC-4, OC-5, OC-10, and OC-11

Coating mixtures were prepared by diluting appropriate amounts of ATO Sol and OC-1 concentrate (adjusted to give the desired ATO:OC-1 solids ratio) to 5 wt % total solids (OC-3, OC-4, OC-5, OC-11) or 9.66% solids (OC-10) using 1:1 IPA:diacetone alcohol.

Overcoat Compositions OC-6, OC-7 and OC-8

Coating mixtures were prepared by diluting appropriate amounts of TC-ZnO Sol and OC-2 concentrate (adjusted to give the desired ZnO:OC-2 solids ratio) to 5 wt % total solids using 1:1 IPA:diacetone alcohol.

Overcoat Composition OC-9

VP AdNano® LRC was diluted to 5 wt % total solids in 1:1 IPA:diacetone alcohol immediately before use.

Overcoat Composition OC-12

A coating mixture was prepared by diluting appropriate amounts of ATO sol and OC-2 in 1:1 IPA:diacetone alcohol to give 75:25 ATO:OC-2 solids ratio at 5 wt % total solids.

Transparent Electrodes 1-41—for Comparative Examples 1-14, Examples 1-27

A silver nanowire ink prepared using the methods disclosed in Example 5 of WO 2008/046058 (Allemand et al.) was coated on 5 mil PET film (Melinex® 618 from DuPont Teijin Films) using a 4 inch die coater operating at a web speed of 10 ft/min, ink flow rate of 3.7 cc/min, drying oven airflow 19.7 msec, and drying oven temperatures of 75° C. (zone 1) and 120° C. (zone 2). Sheet resistance of the resulting coating was 90-100 ohm/sq using a contactless probe (Delcom 727R Non-Contact Conductance Monitor from Delcom Products Inc.), and transmission and haze measured on a Haze-Gard Plus haze meter (BYK-Gardner USA) were found to be 90-91% and 1.4-1.6%, respectively, on the coated films.

The above film was overcoated to make transparent electrode films using the overcoat compositions described above. Coating was performed on the 4 inch die coater used for the ink coating, using the above oven and air flow settings, web speed of 20 ft/min, solution flow rates of 3-9 cc/min as indicated in Table 2, UV plate temperature of 70° F., nitrogen atmosphere, and 100% UV lamp power. Transmission and haze were measured as described above. Results are summarized in Table 2.

TABLE 2

| Transparent Electrode | Overcoat | Flow Rate (cc/min) | Sheet Resistance (ohm/sq) | % T | % H |
|---|---|---|---|---|---|
| 1 | ITO[1] no OC | N/A | 125 | 81 | 0.7 |
| 2 | ITO[1] no OC | N/A | 125 | 81 | 0.7 |
| 3 | OC-1 5% solids | 3 | 115 | 92 | 1.0 |
| 4 | OC-1 5% solids | 5 | 128 | 89 | 1.1 |
| 5 | OC-1 5% solids | 7 | 120 | 92 | 1.1 |
| 6 | OC-1 5% solids | 9 | 107 | 90 | 1.1 |
| 7 | OC-1 3% solids | 3 | 101 | 90 | 1.3 |
| 8 | OC-1 3% solids | 5 | 106 | 89 | 1.1 |
| 9 | OC-1 3% solids | 7 | 107 | 90 | 0.9 |
| 10 | OC-1 3% solids | 9 | 101 | 91 | 1.1 |
| 11 | OC-2 5% solids | 3 | 269 | 90 | 1.6 |
| 12 | OC-2 5% solids | 5 | 117 | 92 | 1.2 |
| 13 | OC-2 5% solids | 7 | 111 | 90 | 1.3 |
| 14 | OC-2 5% solids | 9 | 107 | 92 | 1.3 |
| 15 | OC-3 25:75 ATO:OC-1 | 3 | 102 | 91 | 1.2 |
| 16 | OC-3 25:75 ATO:OC-1 | 5 | 111 | 89 | 1.2 |
| 17 | OC-3 25:75 ATO:OC-1 | 7 | 112 | 90 | 1.3 |
| 18 | OC-3 25:75 ATO:OC-1 | 9 | 119 | 90 | 1.0 |
| 19 | OC-4 50:50 ATO:OC-1 | 3 | 101 | 88 | 1.0 |
| 20 | OC-4 50:50 ATO:OC-1 | 5 | 106 | 88 | 1.1 |
| 21 | OC-4 50:50 ATO:OC-1 | 7 | 122 | 87 | 1.2 |
| 22 | OC-4 50:50 ATO:OC-1 | 9 | 110 | 89 | 1.1 |
| 23 | OC-5 75:25 ATO:OC-1 | 3 | 104 | 91 | 1.2 |
| 24 | OC-5 75:25 ATO:OC-1 | 5 | 106 | 89 | 1.2 |
| 25 | OC-5 75:25 ATO:OC-1 | 7 | 117 | 88 | 1.3 |
| 26 | OC-5 75:25 ATO:OC-1 | 9 | 110 | 88 | 1.4 |
| 27 | OC-6 25:75 ZnO:OC-2 | 3 | 129 | 89 | 1.3 |
| 28 | OC-6 | 5 | 104 | 89 | 1.3 |

TABLE 2-continued

| Transparent Electrode | Overcoat | Flow Rate (cc/min) | Sheet Resistance (ohm/sq) | % T | % H |
|---|---|---|---|---|---|
| 29 | OC-6 25:75 ZnO:OC-2 | 7 | 144 | 88 | 1.3 |
| 30 | OC-6 25:75 ZnO:OC-2 | 9 | 106 | 89 | 1.4 |
| 31 | OC-7 25:75 ZnO:OC-2 | 5 | 213 | 87 | 1.8 |
| 32 | OC-7 50:50 ZnO:OC-2 | 7 | 165 | 89 | 1.7 |
| 33 | OC-7 50:50 ZnO:OC-2 | 9 | 102 | 87 | 1.5 |
| 34 | OC-8 50:50 ZnO:OC-2 | 3 | 169 | 85 | 0.7 |
| 35 | OC-8 75:25 ZnO:OC-2 | 5 | 111 | 84 | 0.8 |
| 36 | OC-8 75:25 ZnO:OC-2 | 7 | 101 | 87 | 0.9 |
| 37 | OC-8 75:25 ZnO:OC-2 | 9 | 113 | 86 | 0.8 |
| 38 | OC-9 75:25 ZnO:OC-2 | 3 | 191 | 89 | 3.5 |
| 39 | " | 5 | 98 | 89 | 4.1 |
| 40 | " | 7 | 106 | 90 | 4.0 |
| 41 | " | 9 | 108 | 90 | 3.8 |

[1]standard vacuum sputtered ITO on 5 mil PET

Displays—Comparative Examples 1-14, Examples 1-27

PDLC displays were prepared using the transparent electrodes described in Table 2. A 50:50 (w/w) blend of BL036 liquid crystal and Norland NOA65 also containing 2 wt % Sekisui SP210 spacer beads was sonicated for 30 min and then laminated between sheets of the transparent electrodes, with the conductive sides contacting the liquid crystal material, allowing the spacer beads to set the gap between the films. The displays were cured by exposure to 2.2 mW/cm² UV light for 10 min using lamps (350 BL) available from Sylvania (Danvers, Mass.). Transmission and haze measurements were performed on the displays in the off state and after switching at 32 and 64 V. Results are summarized in Table 3.

TABLE 3

| Example | Transparent Electrode | OFF State | | ON State 32 V | | ON State 64 V | |
|---|---|---|---|---|---|---|---|
| | | % T | % H | % T | % H | % T | % H |
| Comparative 1 | 1 | 81 | 89 | 81 | 12 | 82 | 11 |
| Comparative 2 | 2 | 71 | 78 | 75 | 13 | 76 | 11 |
| Comparative 3 | 3 | 81 | 88 | 86 | 38 | 86 | 13 |
| Comparative 4 | 4 | 81 | 89 | 86 | 41 | 87 | 14 |
| Comparative 5 | 5 | 84 | 89 | 88 | 60 | 86 | 29 |
| Comparative 6 | 6 | 80 | 81 | 83 | 63 | 87 | 38 |
| Comparative 7 | 7 | 65 | 81 | 84 | 27 | 84 | 16 |
| Comparative 8 | 8 | 63 | 89 | 82 | 23 | 84 | 13 |
| Comparative 9 | 9 | 66 | 85 | 82 | 24 | 84 | 13 |
| Comparative 10 | 10 | 77 | 80 | 81 | 21 | 85 | 20 |
| Comparative 11 | 11 | 85 | 85 | 84 | 15 | 87 | 10 |
| Comparative 12 | 12 | 86 | 87 | 84 | 16 | 85 | 12 |
| Comparative 13 | 13 | 80 | 87 | 83 | 53 | 86 | 28 |
| Comparative 14 | 14 | 77 | 87 | 85 | 79 | 82 | 35 |
| 1 | 15 | 82 | 82 | 88 | 15 | 88 | 11 |
| 2 | 16 | 73 | 84 | 88 | 15 | 87 | 10 |
| 3 | 17 | 79 | 89 | 87 | 15 | 88 | 11 |
| 4 | 18 | 77 | 84 | 87 | 13 | 87 | 9 |
| 5 | 19 | 76 | 89 | 84 | 16 | 85 | 14 |
| 6 | 20 | 81 | 80 | 83 | 16 | 86 | 15 |
| 7 | 21 | 74 | 84 | 84 | 16 | 85 | 14 |
| 8 | 22 | 73 | 85 | 83 | 14 | 85 | 10 |
| 9 | 23 | 72 | 88 | 86 | 13 | 89 | 10 |
| 10 | 24 | 76 | 81 | 85 | 15 | 85 | 13 |
| 11 | 25 | 79 | 86 | 83 | 19 | 85 | 14 |
| 12 | 26 | 79 | 82 | 83 | 16 | 84 | 12 |
| 13 | 27 | 82 | 81 | 86 | 22 | 86 | 15 |
| 14 | 28 | 88 | 87 | 85 | 20 | 87 | 15 |
| 15 | 29 | 80 | 82 | 20 | 33 | 85 | 11 |
| 16 | 30 | 86 | 82 | 85 | 38 | 85 | 9 |
| 17 | 31 | 72 | 85 | 84 | 24 | 85 | 19 |
| 18 | 32 | 69 | 86 | 84 | 19 | 86 | 15 |
| 19 | 33 | 86 | 87 | 86 | 35 | 85 | 9 |
| 20 | 34 | 80 | 84 | 83 | 15 | 84 | 13 |
| 21 | 35 | 80 | 81 | 83 | 14 | 84 | 12 |
| 22 | 36 | 78 | 84 | 84 | 13 | 85 | 10 |
| 23 | 37 | 75 | 80 | 83 | 12 | 84 | 10 |
| 24 | 38 | 59 | 90 | 83 | 24 | 84 | 19 |
| 25 | 39 | 59 | 87 | 84 | 12 | 84 | 7 |
| 26 | 40 | 69 | 87 | 84 | 10 | 84 | 7 |
| 27 | 41 | 71 | 80 | 83 | 10 | 83 | 8 |

Properties of Polymeric Overcoat Layers—Comparative Examples 15-17, Examples 28-42

Overcoat compositions were coated on 5 mil primed PET film using the wire-wound rods listed in Table 4. Coatings were dried at 100° C. for 3 min, then cured using UV processing conditions described above. Measurements of sheet resistance were made using a Keithley 6517A resistance meter equipped with a 8009 test fixture. Coating thickness measurements were made using a Filmetrics (San Diego, Calif.) F20-UV thin film analyzer. Bulk resistivity was computed as the product of these two quantities. Results are shown in Table 4.

TABLE 4

| Example | Overcoat Chemistry | Coating Rod # | Sheet Resistance (ohm/sq) | Film Thickness (cm) | Bulk Resistivity (ohm cm) |
|---|---|---|---|---|---|
| Comparative 15 | OC-1 5% solids | 6 | 3.5 × 10E14 | 3.4 × 10E−5 | 1.2 × 10E10 |
| Comparative 16 | OC-1 5% solids | 12 | 3.3 × 10E14 | 7.4 × 10E−5 | 2.4 × 10E10 |
| Comparative 17 | OC-1 5% solids | 24 | 4.8 × 10E14 | 1.0 × 10E−4 | 4.8 × 10E10 |
| 28 | OC-8 75:25 ZnO:OC-2 | 6 | 5.7 × 10E9 | 2.5 × 10E−5 | 1.4 × 10E5 |
| 29 | OC-8 75:25 ZnO:OC-2 | 12 | 2.2 × 10E9 | 4.7 × 10E−5 | 1.0 × 10E5 |

TABLE 4-continued

| Example | Overcoat Chemistry | Coating Rod # | Sheet Resistance (ohm/sq) | Film Thickness (cm) | Bulk Resistivity (ohm cm) |
|---|---|---|---|---|---|
| 30 | OC-8 75:25 ZnO:OC-2 | 24 | 8.8 × 10E8 | 6.3 × 10E−5 | 5.5 × 10E4 |
| 31 | OC-6 25:75 ZnO:OC-2 | 6 | 1.3 × 10E14 | 3.4 × 10E−5 | 4.4 × 10E9 |
| 32 | OC-6 25:75 ZnO:OC-2 | 12 | 2.7 × 10E13 | 1.1 × 10E−4 | 3.0 × 10E9 |
| 33 | OC-6 25:75 ZnO:OC-2 | 24 | 8.0 × 10E12 | 1.4 × 10E−4 | 1.1 × 10E9 |
| 34 | OC-10 67:33 ATO:OC-1 9.66% solids | 6 | 3.2 × 10E9 | 2.3 × 10E−5 | 7.4 × 10E4 |
| 35 | OC-10 67:33 ATO:OC-1 9.66% solids | 12 | 1.1 × 10E9 | 5.1 × 10E−5 | 5.6 × 10E4 |
| 36 | OC-10 67:33 ATO:OC-1 9.66% solids | 24 | 2.5 × 10E8 | 9.1 × 10E−5 | 2.3 × 10E4 |
| 37 | OC-3 25:75 ATO:OC1[1] | 6 | 2.1 × 10E14 | 5.5 × 10E−5 | 1.2 × 10E10 |
| 38 | OC-3 25:75 ATO:OC1[1] | 12 | 2.2 × 10E14 | 6.4 × 10E−5 | 1.4 × 10E10 |
| 39 | OC-3 25:75 ATO:OC1[1] | 24 | 8.0 × 10E14 | 8.2 × 10E−5 | 6.6 × 10E10 |
| 40 | OC-9 | 6 | 3.4 × 10E7 | 3.0 × 10E−5 | 1.0 × 10E3 |
| 41 | " | 12 | 3.4 × 10E7 | 4.7 × 10E−5 | 1.6 × 10E3 |
| 42 | " | 24 | 2.4 × 10E7 | 5.8 × 10E−5 | 1.4 × 10E3 |

Transparent Electrodes for Comparative Example 19 and Example 43

A silver nanowire ink prepared using the methods disclosed in Example 5 of WO 2008/046058 (Allemand et al.) was coated on 5 mil PET film (Melinex® 618 from DuPont Teijin Films) using a 6" die coater. Web speed was 10 ft/min, ink flow 12.7 ml/min, drying oven air flow 19.7 msec, and drying oven temperatures 75° C. (zone 1) and 120° C. (zone 2). Two 400 ft batches of this film were prepared on different days. For batch 1, sheet resistance of the resulting coating was found to be 45 ohm/sq using a Delcom contactless probe, and transmission and haze measured on a HazeGard were found to be 90.6% and 2.65% respectively. For batch 2, the respective values were 67 ohm/sq, 91.3%, and 2.05%.

The above film was overcoated using the overcoat solutions shown in Table 5 below. Coating was performed on the same 6" die coater using the above oven and air flow settings, web speed of 20 ft/min, solution flow rates of 7-20 ml/min as indicated in the table, UV plate temperature of 70° F., nitrogen atmosphere, and 100% UV lamp power. Table 5 also shows conductivity and optical data on the resultant two-layer transparent conducting coatings. Batch 1 of the silver nanowire film was used to prepare transparent electrode 42, while batch 2 was used to prepare transparent electrode 43.

TABLE 5

| Transparent Electrode | Overcoat | Flow Rate (cc/min) | Sheet Resistance (ohm/sq) | % T | % H |
|---|---|---|---|---|---|
| 42 | Insulating acrylic OC, 3.1% solids | 10 | 48 | 89 | 2.2 |
| 43 | OC-11 60:40 ATO:OC-1 | 10 | 68 | 88 | 2.5 |

Displays—Comparative Examples 18-19, Example 43

G4 PDLC film was obtained from Citala US Inc. (Sunnyvale, Calif.). This construction is a layer of PDLC laminated between two sheets of ITO-coated PET film. One of the ITO PET films was delaminated from one side of the G4 film, then a silver nanowire-based transparent conductor film from Table 5 was laminated to the exposed PDLC by hand. Using a razor blade, PDLC was scraped away to expose a section of the remaining ITO film to enable electrical connection, then silver paste was applied as contact pads to both the ITO and silver nanowire-based electrodes. A potential of 32V (50 Hz square wave) was then applied across the laminate electrodes, and transmission and haze were measured. Results are shown in Table 6 below. Control values were measured for the G4 film as received.

TABLE 6

| Example | Transparent Electrode | Overcoat | % T | % H |
|---|---|---|---|---|
| Comparative 18 | 1 | None -- ITO | 61 | 7 |
| Comparative 19 | 42 | Insulating acrylic OC, 3.1% solids | 61 | 10 |
| 43 | 43 | OC-11, 60:40 ATO:OC-1 | 62 | 8 |

Transparent Electrodes for Comparative Example 21, Examples 44-45

A silver nanowire ink prepared using the methods disclosed in Example 5 of WO 2008/046058 (Allemand et al.) was coated on DuPont 618 5 mil PET film using a 6" die coater. Web speed was 10 ft/min, ink flow 6.4 ml/min, drying oven air flow 19.7 msec, and drying oven temperatures 75° C. (zone 1) and 120° C. (zone 2). Sheet resistance of the resulting coating was found to be 114 ohm/sq, and transmission and haze were 91.2%, and 1.14% respectively.

The above film was overcoated using the overcoat solutions shown in Table 7 below. Coating was performed on a 6" die coater using the above oven and air flow settings, web speed of 20 ft/min, solution flow rates of 9-13 ml/min as indicated in the table, UV plate temperature of 70° F., nitrogen atmosphere, and 100% UV lamp power. Table 7 also shows conductivity and optical data on the resultant two-layer transparent conducting coatings.

TABLE 7

| Transparent Electrode | Overcoat | Flow Rate (cc/min) | Sheet Resistance (ohm/sq) | % T | % H |
|---|---|---|---|---|---|
| 44 | Insulating acrylic OC, 3.1% solids | 10.6 | 120 | 91 | 0.9 |
| 45 | OC-12 | 13 | 115 | 89 | 1.1 |
| 46 | OC-9 | 9 | 99 | 91 | 3.5 |

Displays—Comparative Examples 20-21, Examples 44-45

G4 PDLC film was obtained from Citala US Inc. (Sunnyvale, Calif.). One of the ITO PET films was delaminated from one side of the G4 film, then a silver nanowire-based transparent conductor film from Table 7 was laminated to the exposed PDLC by hand. Using a razor blade, PDLC was scraped away to expose a section of the remaining ITO film to enable electrical connection, then silver paste was applied as contact pads to both the ITO and silver nanowire-based electrodes. A potential of 32V or 64V (50 Hz square wave) was then applied across the laminate electrodes, and transmission and haze were measured in the switched and off states using a Hazegard. Results are shown in Table 8 below. Control values were measured for the G4 film as received.

TABLE 8

| Example | Transparent Electrode | OFF State | | ON State 32 V | | ON State 64 V | |
|---|---|---|---|---|---|---|---|
| | | % T | % H | % T | % H | % T | % H |
| Comparative 20 | 1 | 22.7 | 98 | 61 | 10.7 | 64 | 8.3 |
| Comparative 21 | 44 | 19.8 | 100 | 55 | 18.2 | 63 | 8.5 |
| 44 | 45 | 18.7 | 100 | 59 | 8.3 | 63 | 6.0 |
| 45 | 46 | 22.7 | 98 | 59 | 9.7 | 63 | 7.1 |

All references and publications cited herein are expressly incorporated herein by reference in their entirety, except to the extent they may directly contradict this disclosure. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A transparent electrode comprising:
    a transparent substrate,
    a conductive layer disposed on the transparent substrate and comprising metallic nanowires,
    a colorless polymeric overcoat layer disposed on the conductive layer and comprising nanoparticles comprising antimony tin oxide, wherein a sheet resistance of the polymeric overcoat layer disposed on the transparent substrate without the conductive layer is greater than $2.5 \times 10^8$ ohm/sq.

2. The transparent electrode of claim 1, wherein the sheet resistance of the polymeric overcoat layer disposed on the transparent substrate without the conductive layer is from $2.5 \times 10^8$ to $10^{12}$ ohm/sq.

3. The transparent electrode of claim 1, wherein the sheet resistance of the polymeric overcoat layer disposed on the transparent substrate without the conductive layer is greater than about $10^{12}$ ohm/sq.

4. The transparent electrode of claim 1, having a haze value less than about 5% and a visible light transmission of at least about 80%.

5. The transparent electrode of claim 1, wherein the polymeric overcoat layer comprises the reaction product of a multifunctional (meth)acrylate.

6. The transparent electrode of claim 1, wherein the polymeric overcoat layer comprises a methyl (meth)acrylate polymer and the reaction product of a multifunctional (meth)acrylate.

7. The transparent electrode of claim 1, wherein the polymeric overcoat layer the reaction product of a multifunctional (meth)acrylate and a urethane (meth)acrylate oligomer.

8. The transparent electrode of claim 1, wherein the polymeric overcoat layer comprises a weight ratio of polymer to nanoparticles of about 85:15 to about 25:75.

9. The transparent electrode of claim 1, wherein the electrode is flexible.

10. The transparent electrode of claim 1, wherein the transparent substrate has a glass transition temperature greater than or equal to that of 70° C.

11. A display for providing an image, comprising:
    (a) a first electrode comprising the transparent electrode of claim 1, wherein the transparent substrate comprises a first substrate;
    (b) a second substrate;
    (c) image forming material disposed between the polymeric overcoat layer and the second substrate.

12. The display of claim 11, wherein the second substrate is transparent.

13. The display of claim 11, wherein the second substrate is opaque.

14. The display of claim 11, wherein the sheet resistance of the polymeric overcoat layer disposed on the first substrate without the conductive layer is from about $2.5 \times 10^8$ to $10^{12}$ ohm/sq.

15. The display of claim 11, wherein the sheet resistance of the polymeric overcoat layer disposed on the first substrate without the conductive layer is greater than about $10^{12}$ ohm/sq.

16. The display of claim 11, further comprising a second electrode and drive means for generating potential difference between the first and second electrodes such that the display switches from an off state to an on state.

17. The display of claim 11, wherein the image forming material comprises liquid crystal droplets dispersed in a polymer matrix.

* * * * *

UNITED STATES PATENT AND TRADEMARK OFFICE
CERTIFICATE OF CORRECTION

| | | |
|---|---|---|
| PATENT NO. | : 9,835,913 B2 | Page 1 of 1 |
| APPLICATION NO. | : 13/983593 | |
| DATED | : December 5, 2017 | |
| INVENTOR(S) | : Pellerite et al. | |

It is certified that error appears in the above-identified patent and that said Letters Patent is hereby corrected as shown below:

In the Specification

Column 9
Line 7, after "breaking" insert -- . --.

Column 17
Line 67, delete "msec," and insert -- m/sec, --, therefor.

Column 21
Line 35 (approx.), delete "msec," and insert -- m/sec, --, therefor.

Column 22
Line 58, delete "msec," and insert -- m/sec, --, therefor.

In the Claims

Column 24
Line 47, in Claim 14, after "from" delete "about".

Signed and Sealed this
Tenth Day of July, 2018

Andrei Iancu
*Director of the United States Patent and Trademark Office*